United States Patent
Wu et al.

(10) Patent No.: US 7,502,277 B2
(45) Date of Patent: Mar. 10, 2009

(54) WORD-LINE DRIVER DESIGN FOR PSEUDO TWO-PORT MEMORIES

(75) Inventors: Ching-Wei Wu, Hsin-Chu (TW); Cheng Hung Lee, Hsin Chu (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/599,934

(22) Filed: Nov. 15, 2006

(65) Prior Publication Data

US 2008/0112213 A1    May 15, 2008

(51) Int. Cl.
*G11C 8/00* (2006.01)
(52) U.S. Cl. .............................. 365/230.06; 365/189.24; 365/154; 365/230.05
(58) Field of Classification Search ............ 365/230.06, 365/189.04, 154, 230.05, 189.24
See application file for complete search history.

(56) References Cited

U.S. PATENT DOCUMENTS

| | | | | |
|---|---|---|---|---|
| 5,907,508 A | * | 5/1999 | Lattimore et al. | 365/189.04 |
| 6,061,268 A | | 5/2000 | Kuo et al. | 365/156 |
| 6,856,178 B1 | * | 2/2005 | Narayan | 327/108 |
| 7,193,925 B2 | * | 3/2007 | Hong | 365/230.06 |
| 7,256,609 B2 | * | 8/2007 | Kwean | 326/27 |
| 7,256,621 B2 | * | 8/2007 | Lih et al. | 326/121 |
| 7,313,050 B2 | * | 12/2007 | Lee et al. | 365/230.06 |
| 2007/0035180 A1 | * | 2/2007 | Jang | 307/112 |
| 2007/0097780 A1 | * | 5/2007 | Chen et al. | 365/233 |

* cited by examiner

*Primary Examiner*—Connie C Yoha
(74) *Attorney, Agent, or Firm*—K & L Gates LLP

(57) ABSTRACT

This invention discloses an integrated circuit, which comprises a first and a second pull-down circuit controlled by a first and second signal, respectively, and coupled between a first node and a low voltage power supply (Vss), and a controllable pull-up circuit coupled between the first node and a complimentary high voltage power supply (Vcc), wherein when either the first or second signal is asserted to a predetermined logic state, the first node is pulled down to a logic LOW state.

19 Claims, 13 Drawing Sheets

WORD-LINE DRIVER DESIGN FOR PSEUDO TWO-PORT MEMORIES

BACKGROUND

The present invention relates generally to integrated circuit designs, and, more particularly, to word-line driver designs.

The core of a semiconductor memory comprises at least one two-dimensional memory cell array, where information is stored. Traditionally, word-lines select rows which activate cells and bit-lines select columns, which access, i.e., read or write, cells. When a word line and a bit line are activated, a particular memory cell connected to them is selected.

As memory density increases, the number of word-line drivers or the number of memory cells on a single word-line will increase, in either case, the total size of the word-line driver will increase. Large word-line driver size contributes to a large amount of leakage. In fact, in a static random access memory (SRAM), word-line driver leakage normally contributes to more than half of the total leakage of a SRAM chip.

The number of word-line drivers will even double in two-port SRAMs, as read and write employs separate word-lines. This not only increases a chips' leakage, but also occupies a large chip area. In a pseudo two-port register file case, where speed is less critical, concurrent read and write can be realized by writing after reading a cell in one cycle. Then only one word-line is needed and hence the memory cells can be traditional 6-T SRAM cells.

As such, what is needed is a word-line driver design that can assert a word-line for either read or write operation in the pseudo two-port register file.

SUMMARY

This invention discloses an integrated circuit (IC). According to one aspect of the present invention, the IC comprises a first and a second pull-down circuit controlled by a first and second signal, respectively, and coupled between a first node and a low voltage power supply (Vss), and a controllable pull-up circuit coupled between the first node and a complimentary high voltage power supply (Vcc), wherein when either the first or second signal is asserted to a predetermined logic state, the first node is pulled down to a logic LOW state.

According to another aspect of the present invention, the IC is a word-line (WL) driver for a pseudo two-port memory. The WL driver comprises a first and a second pull-down circuit controlled by a first and second decoded address signal, respectively, and coupled between a first node and a low voltage power supply (Vss), a controllable pull-up circuit coupled between the first node and a complimentary high voltage power supply (Vcc), and a predetermined number of inverters serially connected between the first node and a WL intended to be driven by the WL driver, wherein when either the first or second signal is asserted to a first predetermined logic state, the WL is asserted to a second predetermined logic state.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention will become more readily apparent by referring to the exemplary, and therefore non-limiting embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The present invention discloses a novel word-line driver design for pseudo two-port memories.

Figure 1:
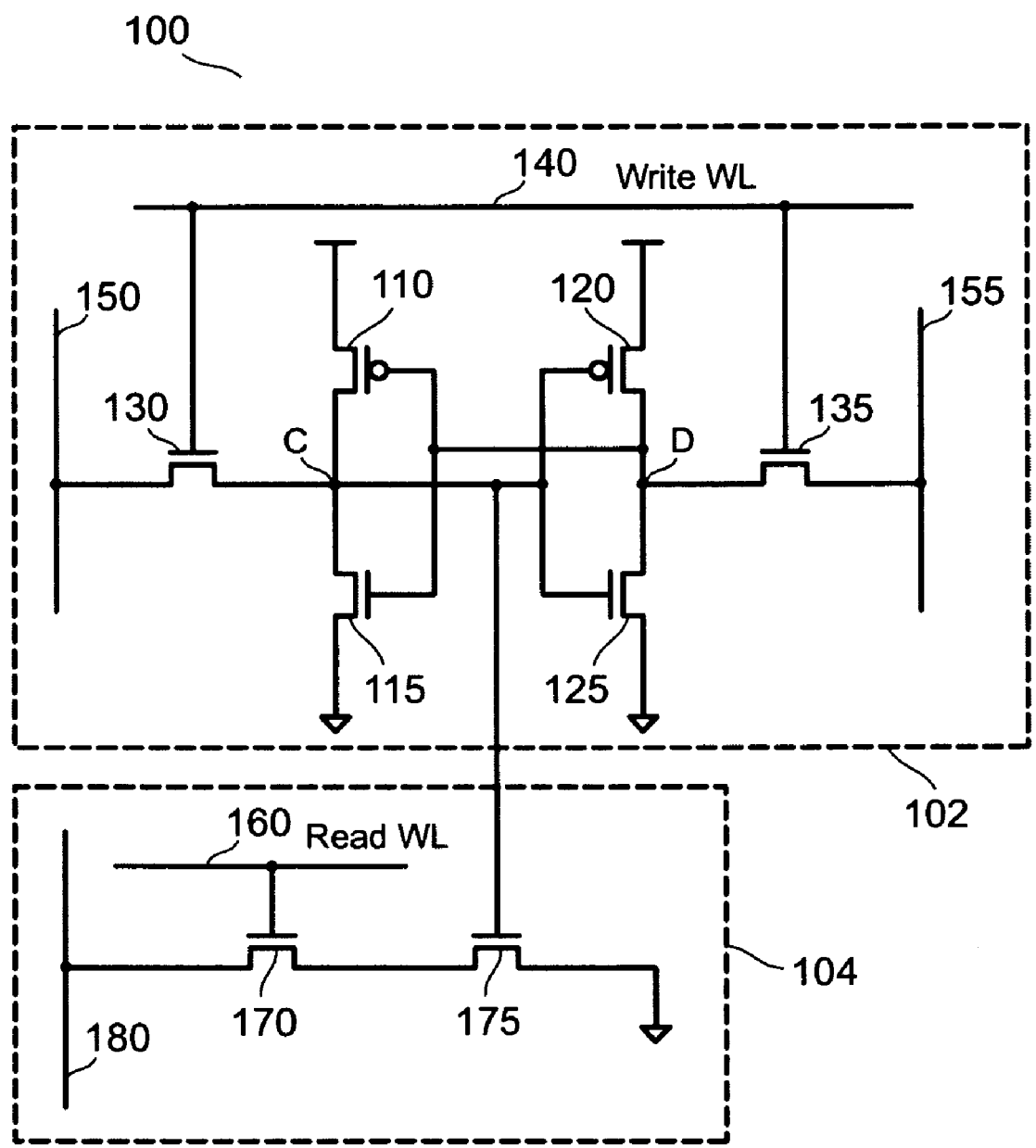
FIG. 1 is a schematic diagram illustrating a conventional 8-T two-port static random access memory (SRAM) cell.

FIG. 1 is a schematic diagram illustrating a conventional 8-T two-port static random access memory (SRAM) cell 100. The conventional 8-T two-port SRAM cell 100 comprises a conventional 6-T SRAM cell 102 and a read path 104 formed by two N-type metal-oxide-semiconductor (NMOS) transistors 170 and 175 serially connected between a read bit-line (BL) 180 and a low voltage power supply (Vss). The read path 104 has a read word-line (WL) 160, separated from a write WL 140 in the 6-T SRAM cell 102. The conventional 6-T SRAM cell 102 is a two inverter cross-coupled type, with the write WL 140 connected to the pass-gate transistors 130 and 135, which controls the access to the storage nodes, C and D of the 6-T SRAM cell 102 by a pair of complimentary bit-lines 150 and 155.

Figure 2A:
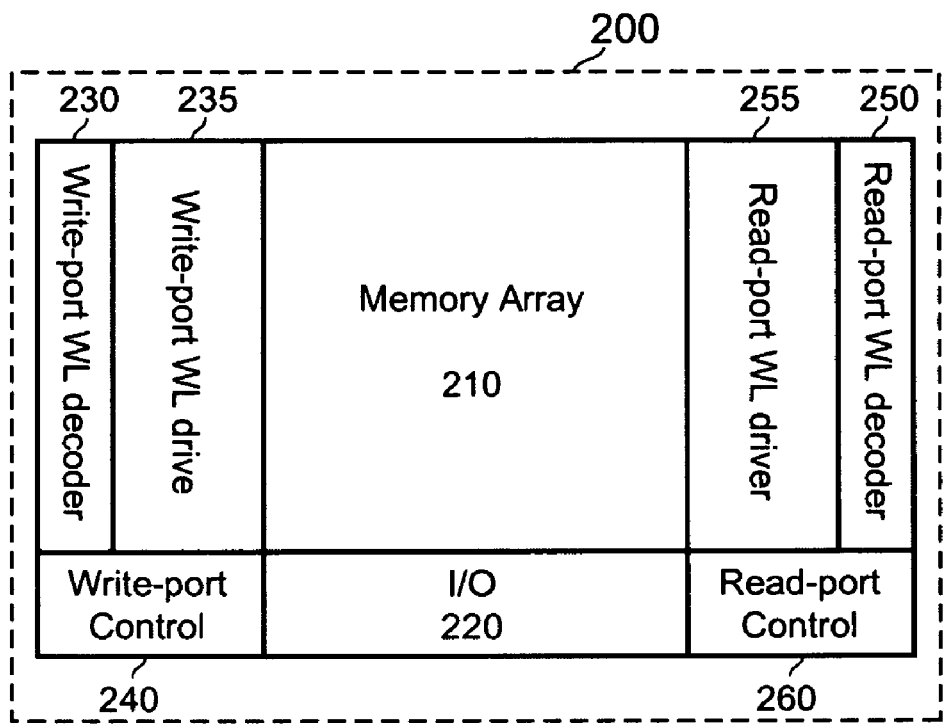
FIG. 2A is a block diagram illustrating a conventional two-port memory block.

FIG. 2A is a block diagram illustrating a conventional two-port memory block 200 with a memory array 210 formed by the 8-T two-port SRAM cells 100 shown in FIG. 1. An input/output block 220 comprises sense amplifiers and column decoders (not shown), and both are connected to the BLs of the memory array 210. The memory block 200 has separate write and read WLs. The write WLs are controlled by a write-port WL decoder block 230 and a write-port WL driver block 235, both of which in turn are controlled by a write-port control block 240. The read WLs are controlled by a read-port WL decoder block 250 and a read-port WL driver block 255, both of which in turn are controlled by a read-port control block 260.

Figure 2B:
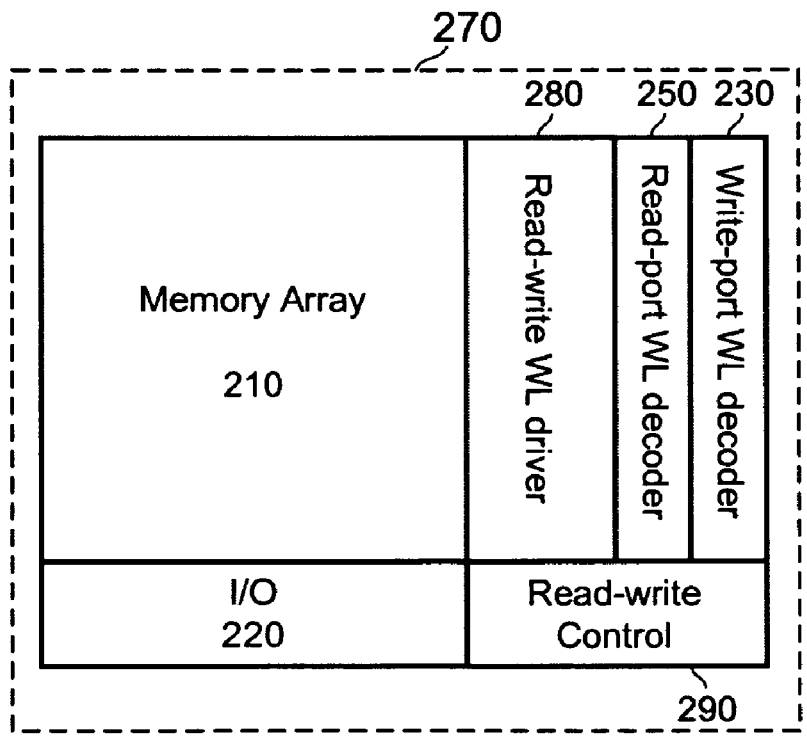
FIG. 2B is a block diagram illustrating a conventional pseudo-two-port memory block.

In comparison, FIG. 2B is a block diagram illustrating a conventional pseudo-two-port memory block 270. Instead of simultaneous reading and writing in the two-port memory block 200, the pseudo-two-port memory block 270 executes a write operation following a read operation within a single cycle, so that there is no need for separate read and write WLs.

The memory array 275 may be implemented by conventional 6-T SRAM cells. Referring to FIG. 2B, the write-port WL decoder block 230 and the read-port WL decoder block 250 still remain separated. But there is only one combined read-write WL driver block 280, and a combined read-write control block 290.

Figure 3:
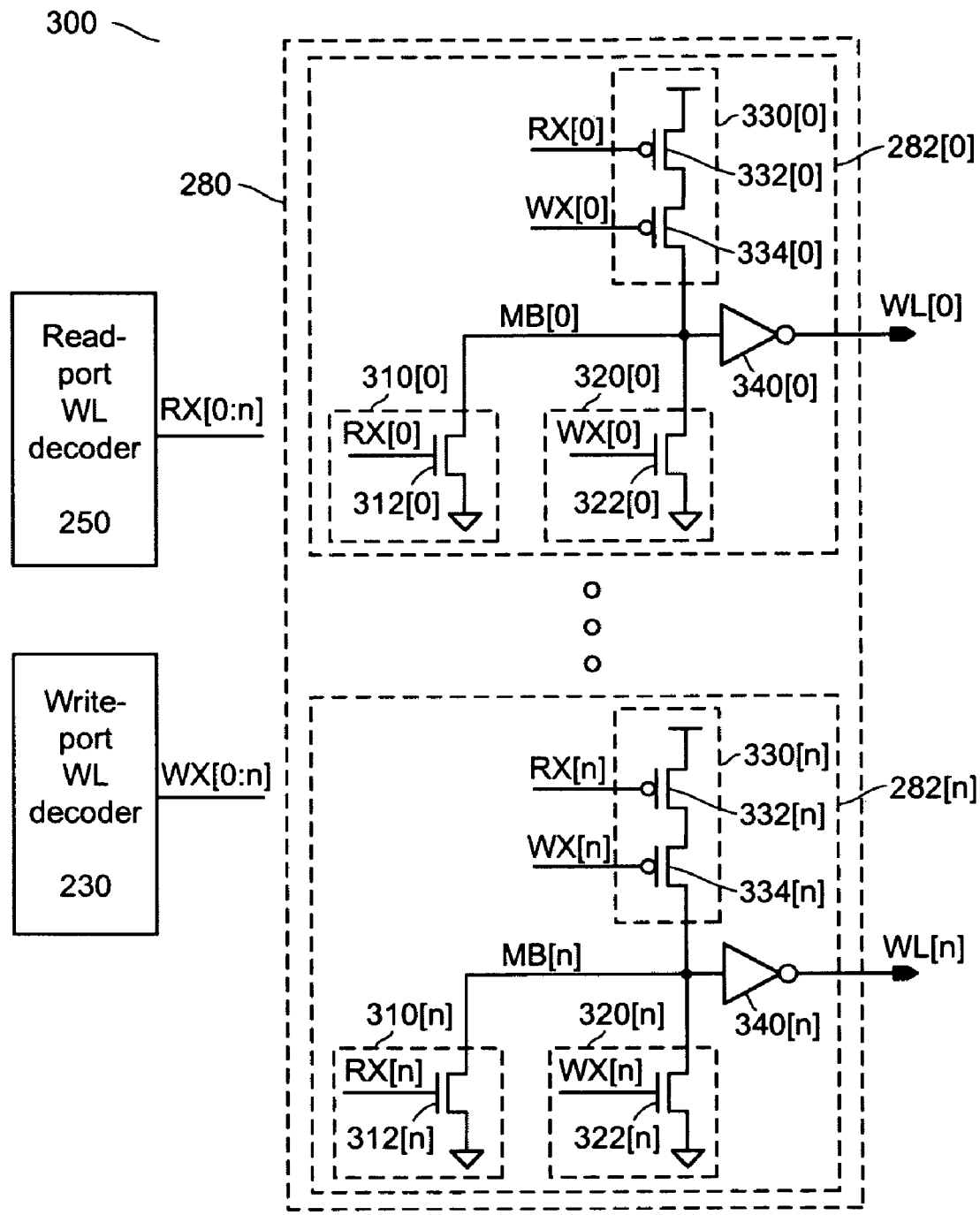
FIG. 3 is a schematic diagram illustrating a read-write word-line driver of the pseudo-two-port memory block according to a first embodiment of the present invention.

FIG. 3 is a schematic diagram illustrating a read-write WL driver block 280 of the pseudo-two-port memory block 300 according to a first embodiment of the present invention. The read-write WL driver block 280 has n+1 number of WL drivers 282[0:n] to drive n+1 number of individual WLs. The read-port WL decoder 250 generates a WL address for read by asserting a selected one of the read address signals RX[0:n]. Similarly, the write-port WL decoder 230 generates a WL address for write by asserting a selected one of the write address signals WX[0:n]. Conventionally, there is only one address selected at a time, and asserting an address signal RX or WX is to turn the signal to a logic HIGH state while unasserted ones remain at a logic LOW state.

Referring to FIG. 3, the WL driver 282[x], where x is an integer between 0 and n, comprises a read pull-down block 310[x], a write pull-down block 320[x], a pull-up block 330[x] and an inverting driver 340[x]. The read pull-down block 310[x] may be implemented as an N-type metal-oxide-semiconductor (NMOS) transistor 312[x] with a source coupled to a low voltage power supply (Vss), a gate coupled to the read address signal RX[x] and a drain coupled to a node MB[x], which serves as an input terminal to the inverting driver 340[x]. Similarly, the write pull-down block 320[x] may also be implemented as a NMOS transistor 322[x] with a source coupled to the Vss, a gate coupled to the write address signal WX[x] and a drain coupled to node MB[x]. When either one or both of the signals RX[x] or WX[x] are asserted to the logic HIGH state, the NMOS transistor 312[x] or 322[x] or both will be turned on and force node MB[x] to Vss.

The pull-up block 330[x] may be implemented as two cascoded P-type metal-oxide-semiconductor (PMOS) transistors, 332[x] and 334[x], coupled between a complimentary high voltage power supply (Vcc) and node MB[x]. A gate of the PMOS transistor 332[x] is coupled to the read address signal RX[x]. A gate of the PMOS transistor 334[x] is coupled to the write address signal WX[x]. There is no difference if the connections of the signals RX[x] and WX[x] are swapped. When either one or both of the signals RX[x] or WX[x] are asserted to the logic HIGH state, the PMOS transistor 332[x] or 334[x] or both will be turned off and release node MB[x] from being pulled up to Vcc. Under this condition as aforementioned, the NMOS transistors 312[x] or 314[x] or both will pull node MB[x] to Vss. Then the corresponding WL[x] will be asserted to the logic HIGH state, and all the other unselected WLs remain at the logic LOW state.

Figure 4A:
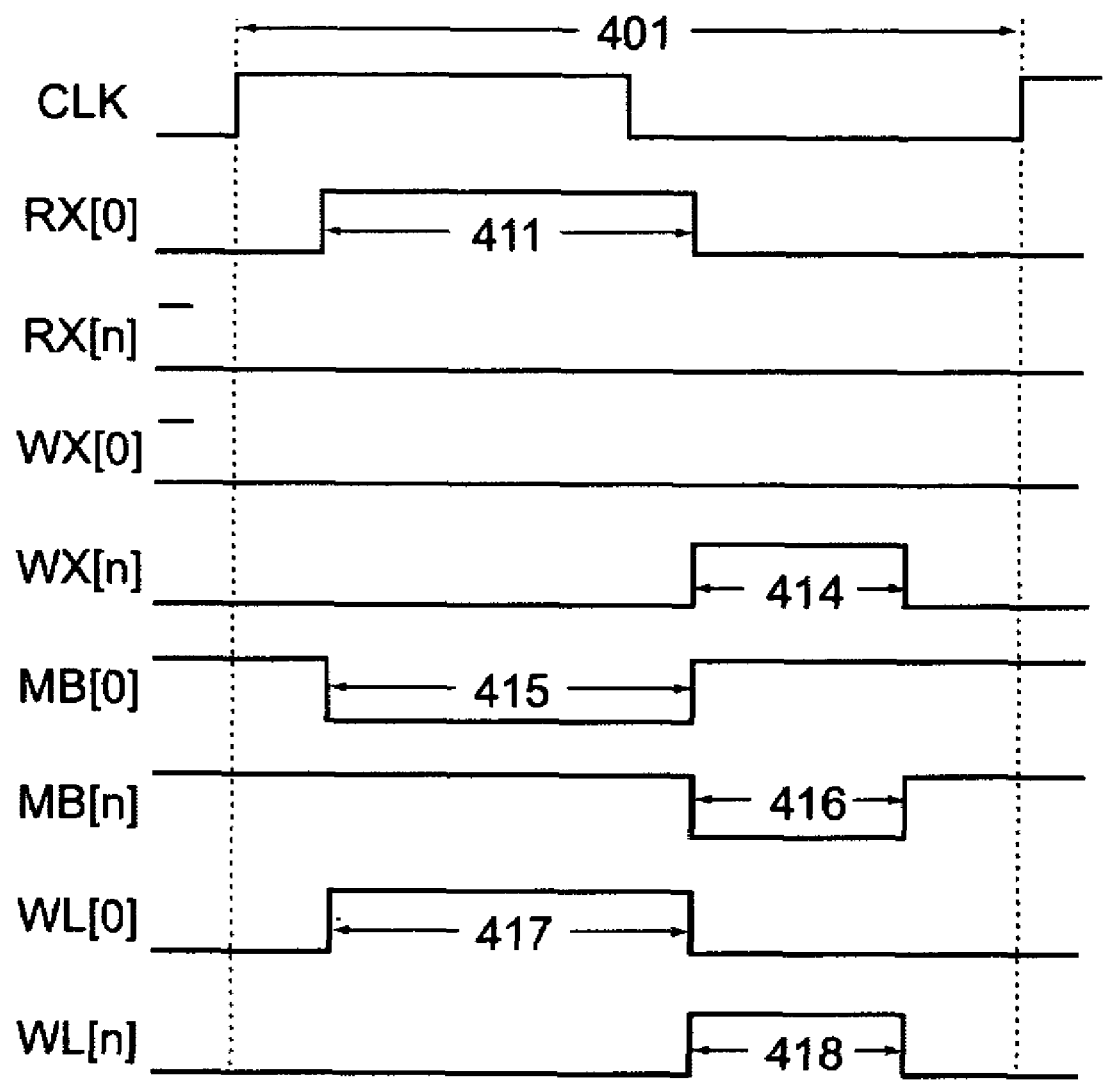
FIGS. 4A~4D are timing diagrams illustrating operations of the first embodiment of the present invention.

FIGS. 4A–4D are timing diagrams illustrating operations of the first embodiment of the present invention shown in FIG. 3. FIG. 4A shows that both read and write occurs in a single cycle but to different WLs. Within a clock (CLK) cycle 401, both a read address RX[0] and a write address WX[n] are asserted to the logic HIGH state during time periods 411 and 414, respectively, though accessing different WLs. RX[0] is for reading at WL[0], and WX[n] is for writing at WL[n]. Referring to both FIGS. 3 and 4A, the asserted RX[0] in time period 411 turns on the NMOS transistor 312[0] and turns off the PMOS transistor 332[0], so that node MB[0] is pulled down to the Vss during a time period 415 corresponding to the time period 411, and hence WL[0] is asserted during time period 417. Similarly, the asserted WX[n] in time period 414 turns on the NMOS transistor 322[n] and turns off the PMOS transistor 334[n], so that node MB[n] is pulled down to the Vss during a time period 416 corresponding to the time period 414, and in turn the WL[n] is asserted to the logic HIGH state during time period 418 corresponding to the time period 416.

Figure 4B:
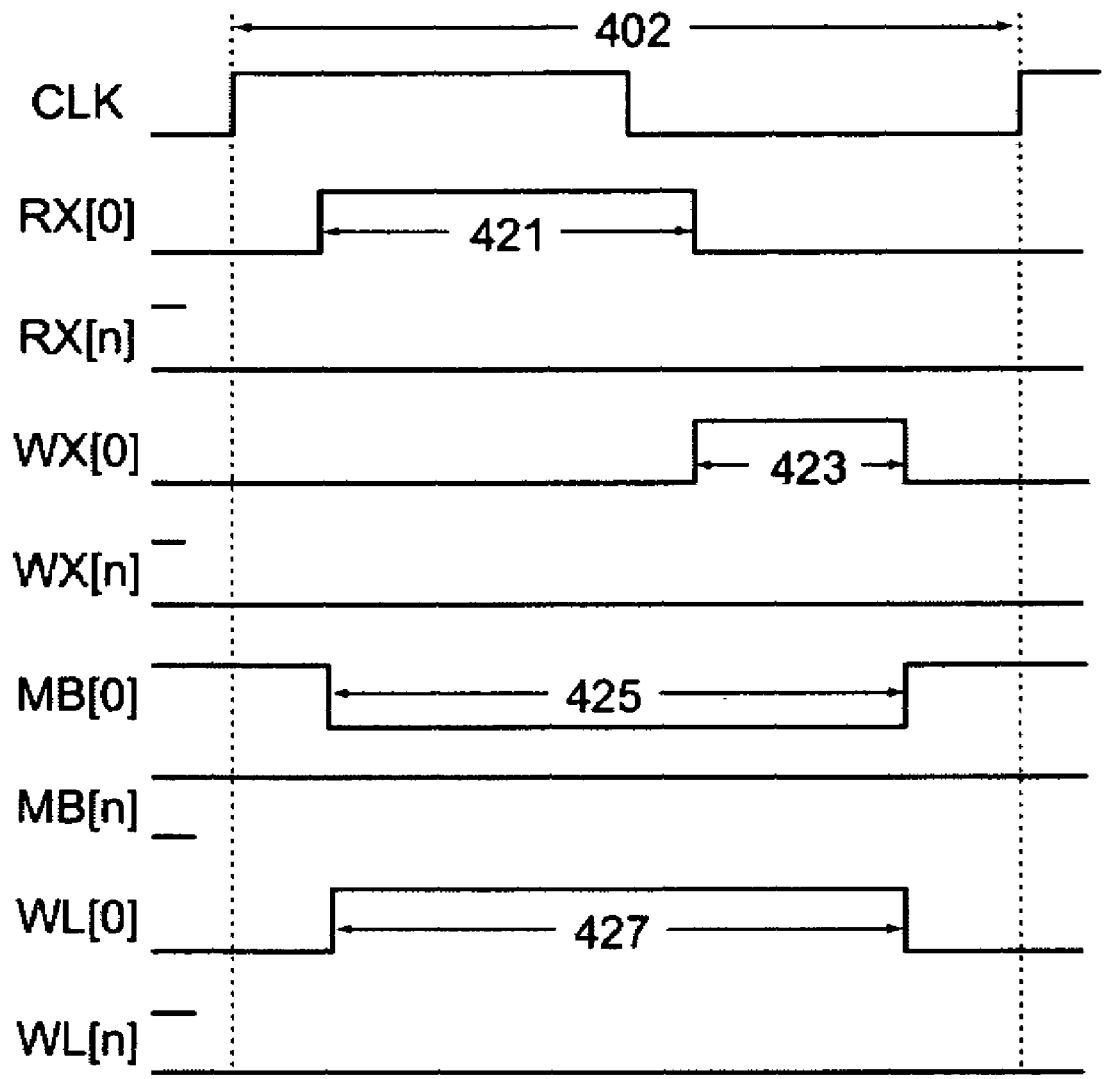

FIG. 4B shows that both read and write occurs in a single cycle and to the same WL. Within the clock (CLK) cycle 402, both a read address RX[0] and a write address WS[0] are asserted to the logic HIGH state during time periods 421 and 423, respectively. RX[0] is for reading at WL[0] and WX[0] is for writing at WL[0]. The time period 423 follows the time period 421, therefore the writing follows the reading. Referring to both FIGS. 3 and 4B, the asserted RX[0] in time period 421 turns on the NMOS transistor 312[0] and turns off the PMOS transistor 332[0]. Subsequently, the WX[0] in time period 423 turns on the NMOS 322[0] and turns off the PMOS transistor 334[0]. This results in node MB[0] being pulled down to the Vss during a time period 425 which corresponds to a sum of the time periods 421 and 423. The pulled down note MB[0] in turn asserts the WL[0] to the logic HIGH state during the time period 427 corresponding to the time period 425.

Figure 4C:
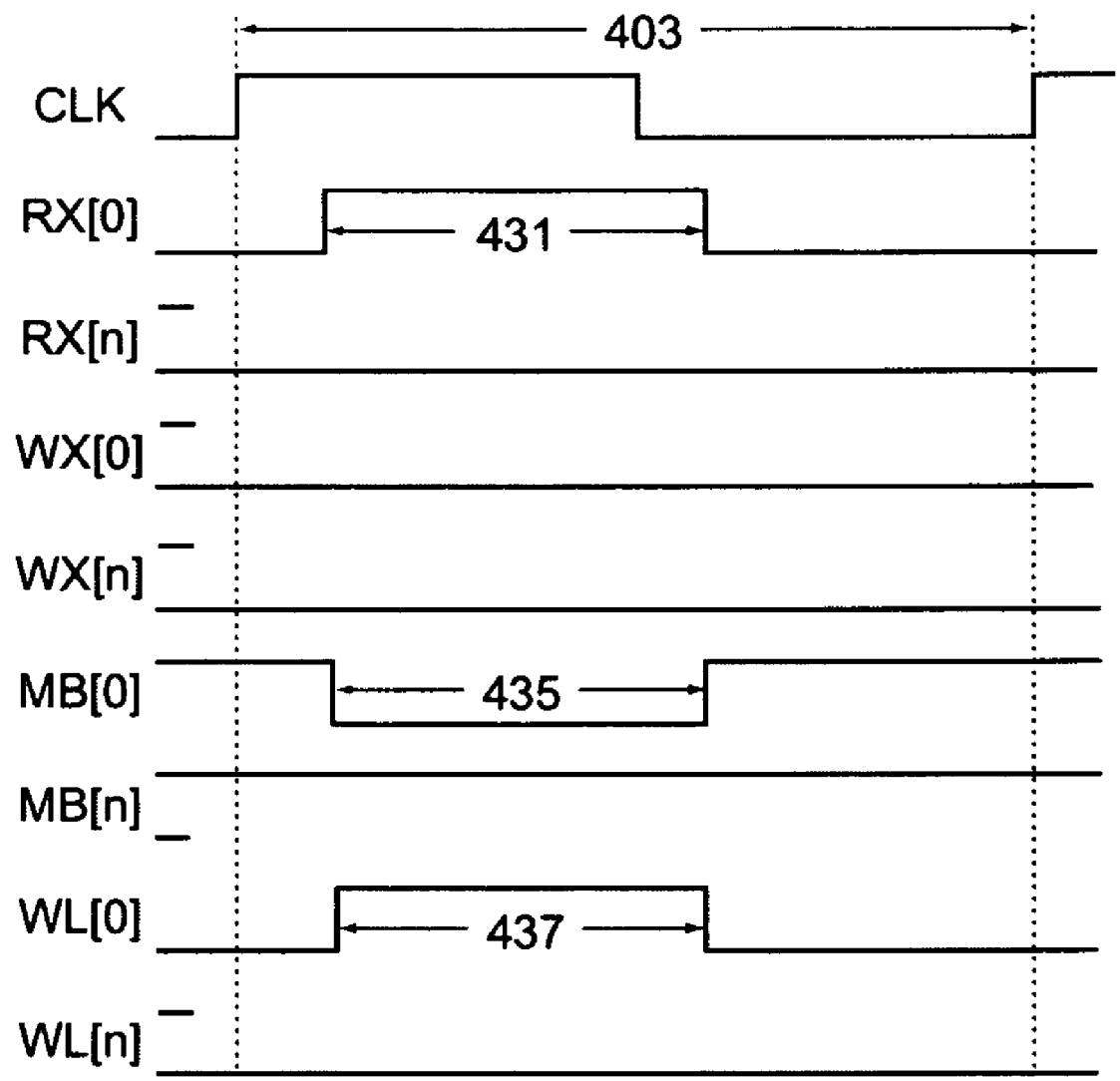

FIG. 4C shows that only read occurs in a clock (CLK) cycle 403, in which only the read address RX[0] is asserted to the logic HIGH state during a time period 431 for reading. The asserted RX[0] turns on the NMOS transistor 312[0] and turns off the PMOS transistor 332[0], and hence pulls down node MB[0] to the Vss during a time period 435 corresponding to the time period 431. The pulled down node MB[0] in turn asserts the WL[0] to the logic HIGH state during a time period 437 corresponding to the time period 435.

Figure 4D:
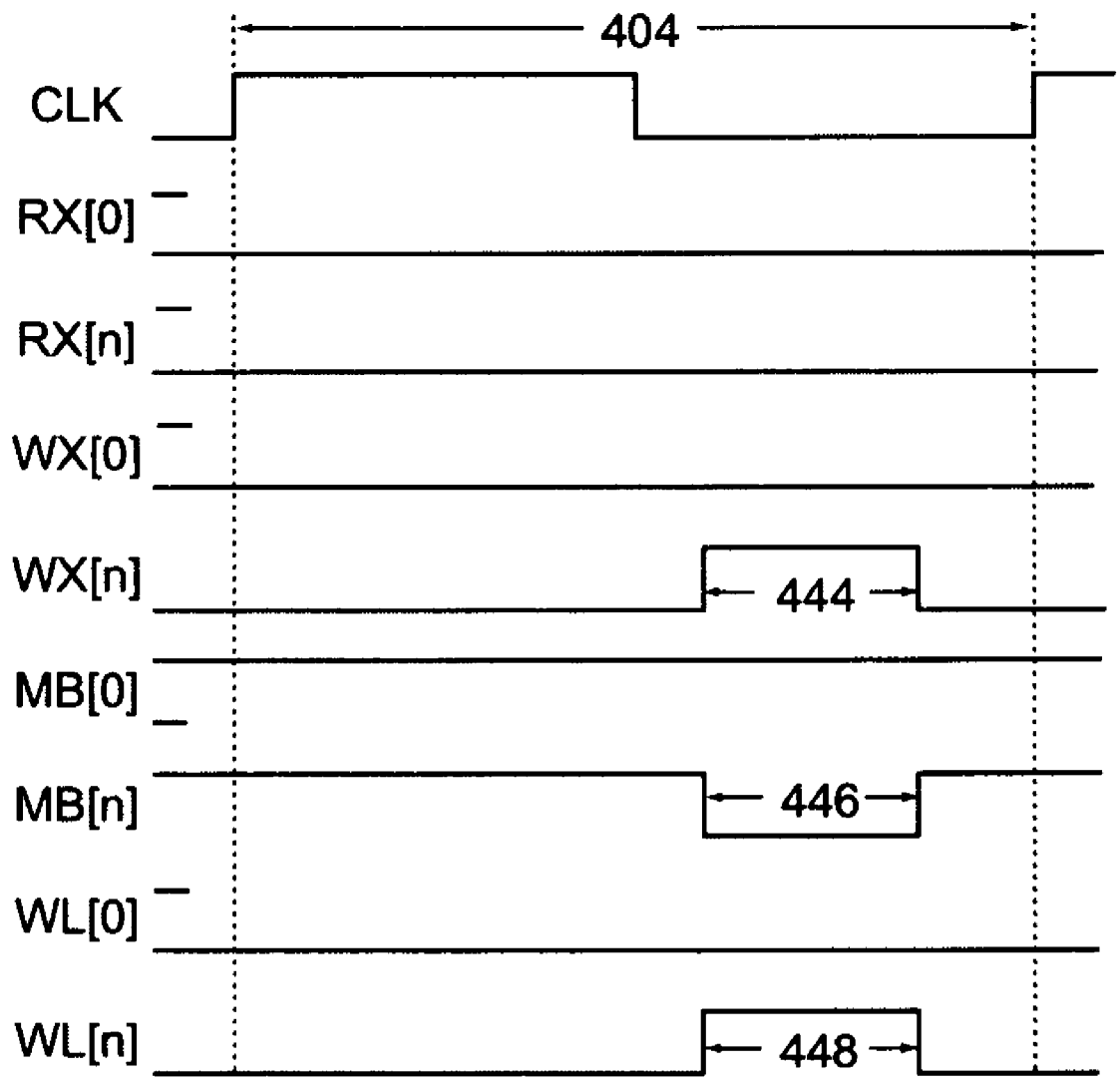

FIG. 4D shows that only write occurs in a clock (CLK) cycle 404 in which only the write address WX[n] is asserted to the logic HIGH state during a time period 444 for writing. The asserted WX[n] turns on the NMOS transistor 322[n] and turns off the PMOS transistor 334[n], and hence pulls down node MB[n] to the Vss during a time period 446 corresponding to the time period 444. The pulled down node MB[n] in turn asserts the logic HIGH state during a time period 448 corresponding to the time period 446.

Apparently, due to the fact that a write and a read operate in two non-overlapping time periods of a cycle, the write and read operations are independent of each other. Both write and read may occur in a single cycle to the same address or different addresses, or they may individually happen in different cycles.

Figure 5:
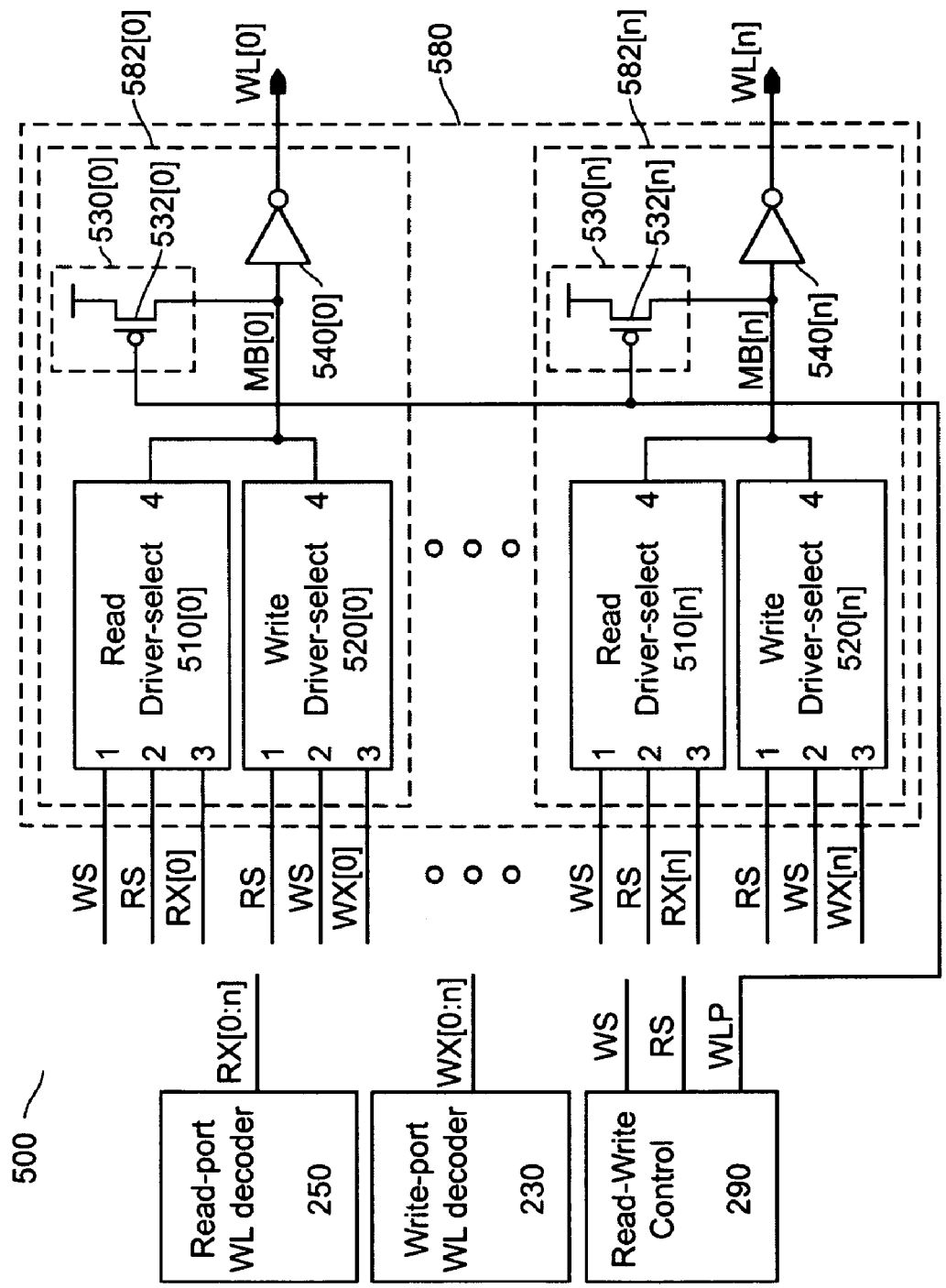
FIG. 5 is a schematic diagram illustrating another read-write word-line driver of the pseudo-two-port memory block according to a second embodiment of the present invention.

FIG. 5 is a schematic diagram illustrating another read-write word-line driver of the pseudo-two-port memory block 500 according to a second embodiment of the present invention. The memory block 500 differs from the memory block 300 in the constructions of the WL driver 582[x], where x is an integer between 0 and n, and in read-write control logics. Here the WL driver 582[x] comprises a read driver-select block 510[x], a write driver-select block 520[x], a pull-up block 530[x] and an inverting driver 540[x]. Signals WS and RS generated by a read-write control block 290 are coupled to both the read driver-select block 510[x] and the write driver-select block 520[x]. Note that the signal WS is coupled to an input terminal 1 of the read driver-select block 510[x], while it is coupled to an input terminal 2 of the write driver-select block 520[x]. Similarly, the signal RS is coupled to an input terminal 2 of the read driver-select block 510[x], while it is coupled to an input terminal 1 of the write driver-select block 520[x]. A read address signals RX[x] is coupled to an input terminal 3 of the read driver-select blocks 510[x]. A write address signal WX[x] is coupled to an input terminal 3 of the write driver-select blocks 520[x]. The output terminals of both the read drive-select block 510[x] and the write driver-select block 520[x] are coupled to node MB[x] and serves as an input terminal of the inverting driver 540[x]. A signal WLP also generated by the read-write control block 290 is coupled to all the pull-up blocks 530[0:n]. The pull-up block 530[x] is coupled between the Vcc and node MB[x]. When the signal WLP is asserted, the pull-up block 530[x] may be turned off from pulling node MB[x] to the Vcc.

Referring to FIG. 5, the pull-up block 530[x] may simply be implemented as a PMOS transistor 532[x] with a gate coupled to the signal WLP, a source coupled to the Vcc and a drain coupled to node MB[x]. When the signal WLP is asserted to the logic HIGH state, the PMOS transistor 532[x] will be turned off, and node MB[x] will no longer be pulled up to Vcc. Then when either the read driver-select block 510[x] or the write driver-select block 520[x] or both are asserted to the logic LOW state, node MB[0] will be pulled down to the Vss, and in turn assert the WL[x] to the logic HIGH state.

Figure 6:
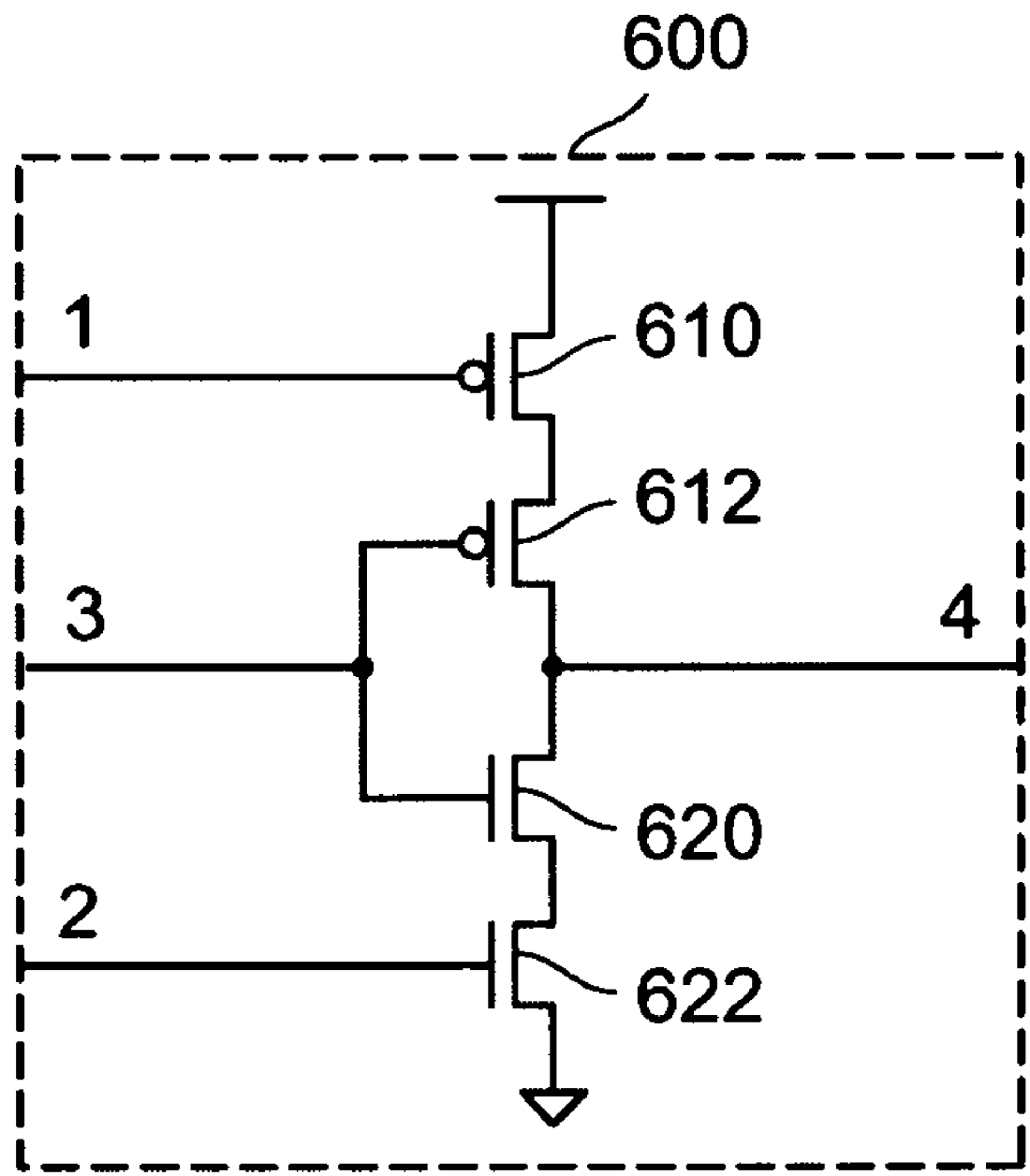
FIG. 6 is a schematic diagram illustrating an implementation of a driver-select circuit employed in the read-write word-line driver shown in FIG. 4.

FIG. 6 is a schematic diagram illustrating an implementation 600 of both the read and write driver-select blocks 510[x] and 520[x], respectively. Two cascoded PMOS transistors 610 and 612 and two cascoded NMOS transistors 620 and 622 are serially connected between the Vcc and Vss. A source and a gate of the PMOS transistor 610 are coupled to the Vcc and an input terminal 1, respectively. A source and a gate of the NMOS transistor 622 is coupled to the Vss and an input terminal 2, respectively. Gates of the PMOS transistor 612 and the NMOS transistor 620 are tied together and coupled to an input terminal 3. Drains of the PMOS transistor 612 and the NMOS transistor 620 are tied together and coupled to an output terminal 4. The terminals of the implementation 600 matches the terminals of the read driver-select block 510[x] and the write driver-select block 520[x] by the numbers when replacing the blocks 510[x] and 520[x] by the implementation 600. For instance, terminal 1 of the implementation 600 matches terminal 1 of the read driver-select block 510[x] as well as terminal 1 of the write driver-select block 520[x].

When the read driver-select block 510[x] is implemented as the implementation 600, the block 510[x] is designed to have two kinds of outputs, one is the logic LOW state, and the other is a high impedance (HIGH-Z) state. For the block 510[x] to output the logic LOW state, the signals RX[x] and RS must be asserted to the logic HIGH state. By design, the signals RS and WS will not be asserted simultaneously. For the block 510[x] to output the HIGH-Z state, the signals RX[x] and RS must remain at the logic LOW state, and the signal WS must be asserted to the logic HIGH state. Similarly, when the write driver-select block 520[x] is implemented as the implementation 600, the block 520[x] is designed also to have two kinds of outputs, one is the logic LOW state, and the other is the HIGH-Z state. For the block 520[x] to output the logic LOW state, the signals WX[x] and WS must be asserted to the logic HIGH state, and the signal RS may remain at the logic LOW state, as aforementioned that by design, the signals RS and WS will not be asserted simultaneously. For the block 520[x] to output the HIGH-Z state, the signals WX[x] and WS must remain at the logic LOW state, and the signal RS must be asserted to the logic HIGH state. By design, when the block 510[x] outputs the logic HIGH state, the block 520[x] must output the HIGH-Z state, and vice versa, to prevent excessive active current flowing between the two blocks 510[x] and 520[x]. When a WL[x] is not addressed to be asserted, its corresponding blocks 510[x] and 520[x] both output the logic LOW state, and the pull-up block 530[x] remains pulling up node MB[x], and they are achieved by sending the signals WS, RS, RX[x], WS[x] and WLP to the logic LOW state.

Figure 7A:
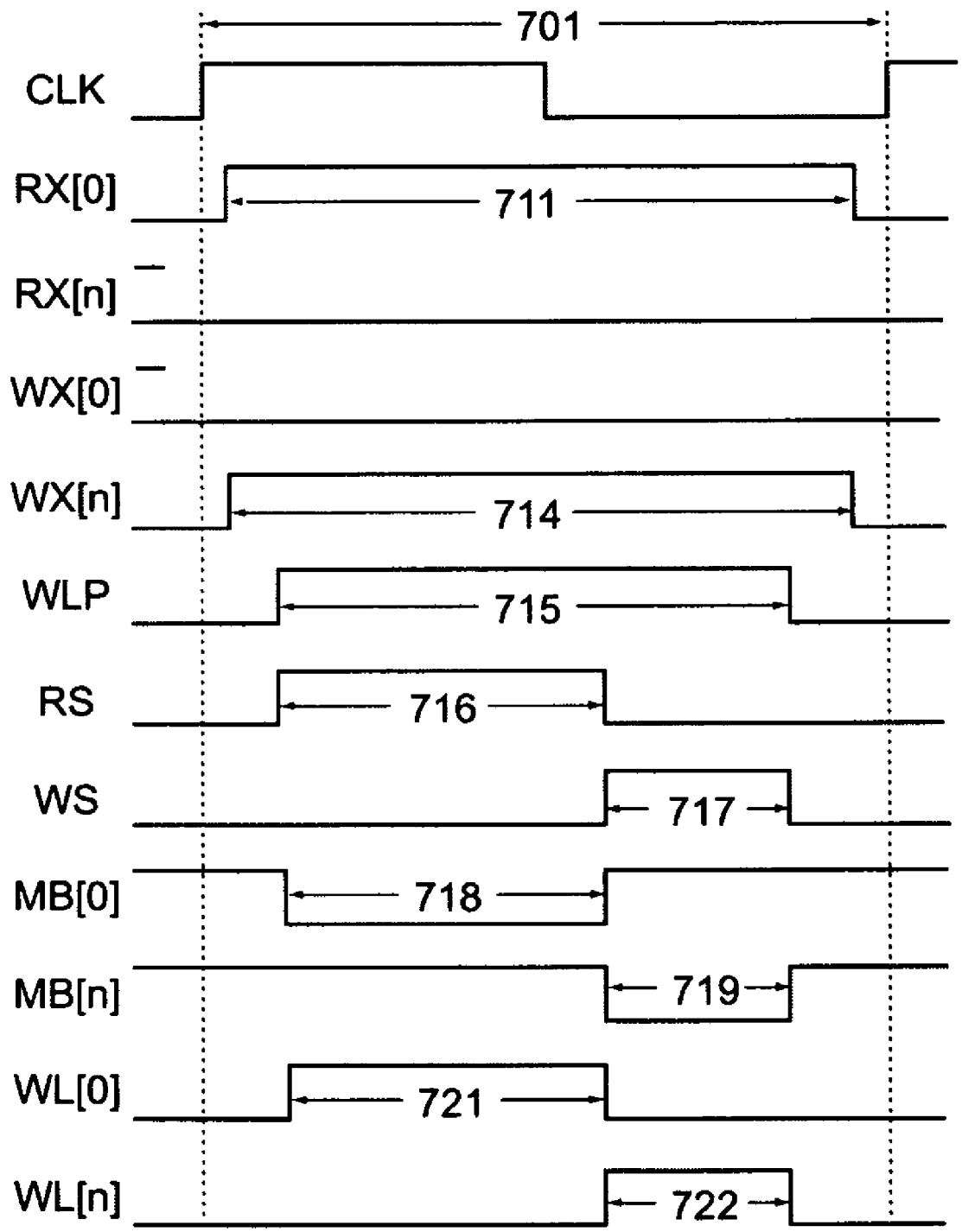
FIGS. 7A~7D are timing diagrams illustrating operations of the second embodiment of the present invention.

FIGS. 7A~7D are timing diagrams illustrating operations of the second embodiment of the present invention. Here both the read driver-select block 510[x] and the write driver-select block 520[x] are replaced by the implementation 600 shown in FIG. 6. FIG. 7A shows that both read and write occurs in a single cycle but to different WLs. Within a clock (CLK) cycle 701, both a read address RX[0] and a write address WX[n] are asserted to the logic HIGH state during time periods 711 and 714, respectively, though accessing different WLs. The signal RX[0] is for reading at WL[0], and the signal WX[n] is for writing at WL[n]. The time periods 711 and 714 are substantially overlapping. In fact, they may be driven by the same signal. The signal WLP is asserted to the logic HIGH state in time period 715 corresponding to both the time periods 711 and 714, or the time periods 711, 714 and 715 have substantially the same length. The signal RS is asserted to the logic HIGH state during a time period 716 for reading, followed by the signal WS asserted to the logic HIGH state during a time period 717. By design, the time period 716 and 717 have no overlap. The time period 716 may rise later than the time period 711, and the time period 717 may fall earlier than the time period 714. As a result of the assertion of the signals RX[0], RS and WLP, node MB[0] is pulled down to the logic LOW state in a time period 718, and the word-line WL[0] in turn is asserted to the logic HIGH state in a time period 721. Both the time period 718 and 721 correspond to the time period 716. As a result of the assertion of the signals WX[n], WS and WLP, node MB[n] is pulled down to the logic LOW state in a time period 719, and the word-line WL[n] in turn is asserted to the logic HIGH state in a time period 722. Both the time period 719 and 722 correspond to the time period 717.

Figure 7B:
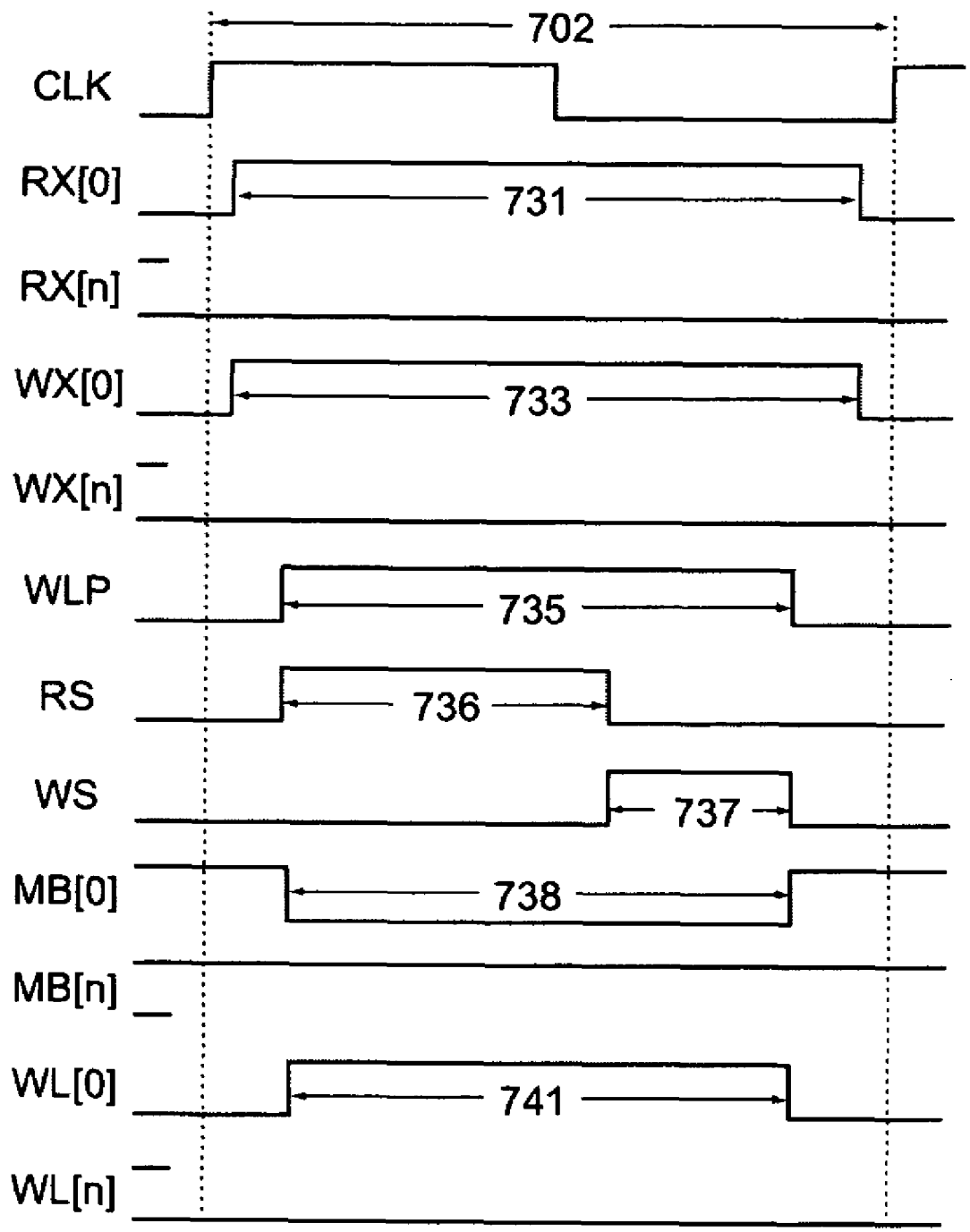

FIG. 7B shows that both read and write occurs in a single cycle and to the same WL. Within the clock (CLK) cycle 702, both a read address RX[0] and a write address WS[0] are asserted to the logic HIGH state during time periods 731 and 733, respectively. RX[0] is for reading at WL[0] and WX[0] is for writing at WL[0]. The signal WLP is asserted to the logic HIGH state during a time period 735, which corresponds to both the time periods 731 and 733. Similar to the case shown in FIG. 7A, the signal RS is asserted to the logic HIGH state in a time period 736 for writing to WL[0], and the signal WS is asserted to the logic HIGH state in a time period 737 for writing to WL[0]. The time period 736 follows the time period 737, therefore the writing follows the reading. As a result of the subsequent asserting of the signals RS and WS along with the signals RX[0], WX[0] and WLP, node MB[0] is pulled down to the logic LOW state during the time period 738, which may be a sum of time periods 736 and 737, and in turn, the word-line WL[0] is asserted to the logic HIGH state during the time period 741, which corresponds to the time period 738.

Figure 7C:
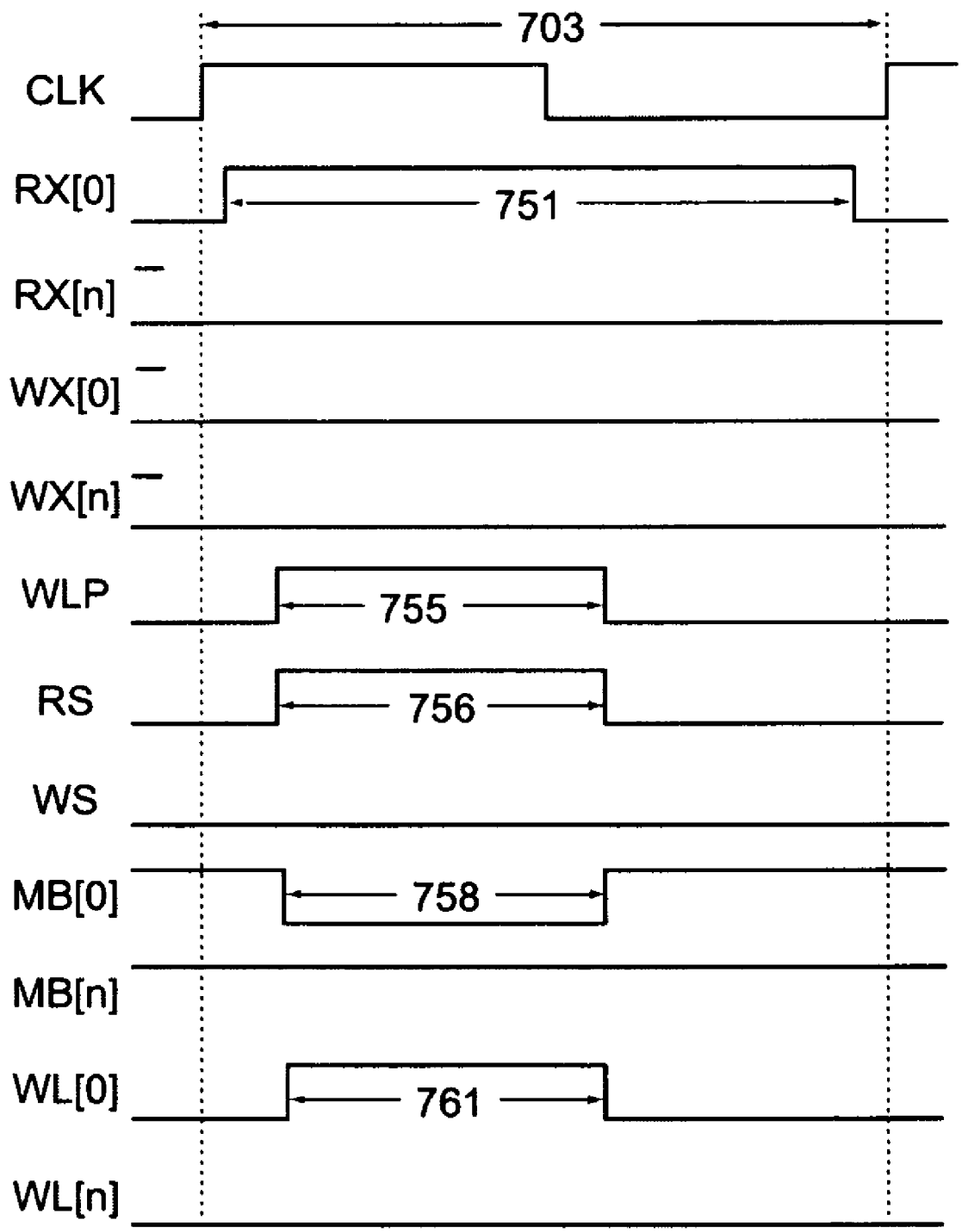

FIG. 7C shows that only read occurs in a clock (CLK) cycle 703, in which only the read address RX[0] is asserted to the logic HIGH state during a time period 751 for reading. For one having skill in the art, it is apparent that the case shown in FIG. 7C is similar to the case shown in FIG. 7A with only the signal RS is asserted to the logic HIGH state during a time period 756. The signal WLP is asserted to the logic HIGH state during a time period 755 only to cover the time period 756, i.e., the signals WLP and RS rise and fall at substantially the same time. Node MB[0] is pulled down to the logic LOW state during a time period 758, which in turn asserts the word-line WL[0] to the logic HIGH state during a time period 761. Both the time period 758 and 761 correspond to the time period 756.

Figure 7D:
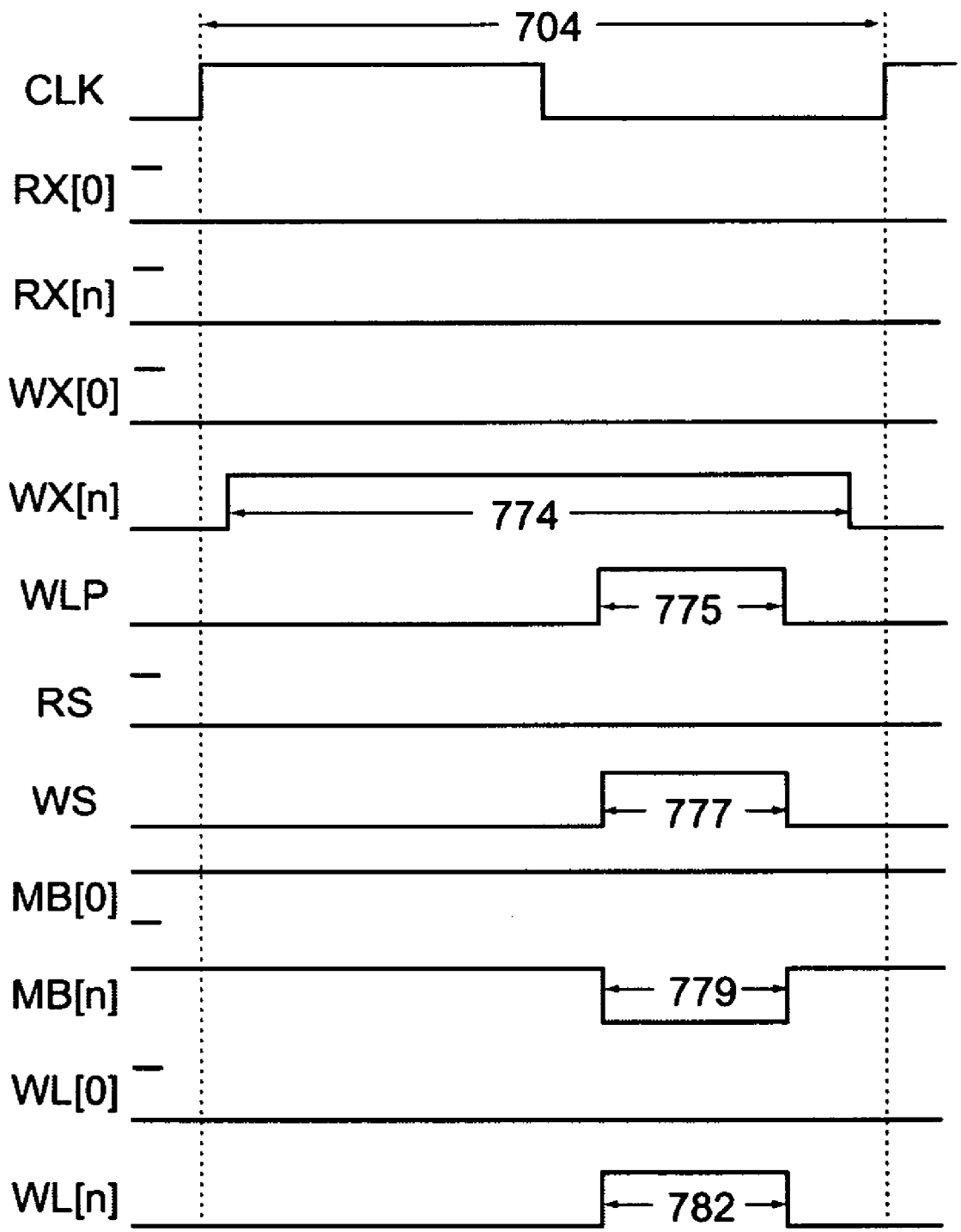

FIG. 7D shows that only write occurs in a clock (CLK) cycle 704 in which only the write address WX[n] is asserted to the logic HIGH state during a time period 774 for writing. For one having skill in the art, it is apparent that the case shown in FIG. 7D is also similar to the case shown in FIG. 7A with only the signal WS is asserted to the logic HIGH state during a time period 777. The signal WLP is asserted to the logic HIGH state during a time period 775 only to cover the time period 777, i.e., the signals WLP and RS rise and fall at substantially the same time. Node MB[n] is pulled down to the logic LOW state during a time period 779, which in turn asserts the word-line WL[n] to the logic HIGH state during a time period 782. Both the time period 779 and 782 correspond to the time period 777.

The above illustrations provide many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit (IC) comprising:
   a first and a second pull-down circuits controlled by a first and second signals, respectively, and coupled between a first node and a low voltage power supply (Vss); and
   a controllable pull-up circuit coupled between the first node and a complimentary high voltage power supply (Vcc), the pull-up circuit further comprising a first PMOS transistor connected in series to a second PMOS transistor, wherein a gate of the first PMOS transistor is coupled to the first signal and a gate of the second PMOS transistor is coupled to the second signal,
   wherein when either the first or second signal is asserted to a predetermined logic state, the first node is pulled down to a logic LOW state, and
   wherein the first and second signals are decoded address signals.

2. The IC of claim 1 further comprising a predetermined number of inverters serially connected between the first node and a signal line intended to be driven by the IC.

3. The IC of claim 1, wherein
   the first pull-down circuit comprises at least one first N-type metal-oxide-semiconductor (NMOS) transistor with a gate coupled to the first signal, a source coupled to the Vss and a drain coupled to the first node; and
   the second pull-down circuit comprises at least one second NMOS transistor with a gate coupled to the second signal, a source coupled to the Vss and a drain coupled to the first node.

4. The IC of claim 3, wherein the predetermined logic state is a logic HIGH state.

5. The IC of claim 4, wherein when either the first or second signal is asserted to a logic HIGH state, the first node will stop being pulled up to the Vcc.

6. The IC of claim 1 further comprising:
   a third and fourth signals coupled to the first and second pull-down circuit; and
   a fifth signal coupled to the controllable pull-up circuit,
   wherein the controllable pull-up circuit comprises at least one PMOS transistor with source and drain coupled between the first node and the Vcc and a gate coupled to the fifth signal; and
   wherein the first pull-down circuit comprises:
   a first and second cascoded PMOS transistors coupled between the Vcc and the first node, wherein a gate of the first cascoded PMOS transistor is coupled to the first signal and a gate of the second cascoded PMOS transistor is coupled to the third signal; and
   a first and second cascoded NMOS transistor coupled between the first node and the Vss wherein a gate of the first cascoded NMOS transistor is coupled to the first signal and a gate of the second cascoded NMOS transistor is coupled to the fourth signal; and
   wherein the second pull-down circuit comprises:
   a third and fourth cascoded PMOS transistor coupled between the Vcc and first node, wherein a gate of the third cascoded PMOS transistor is coupled to the second signal and a gate of the fourth cascoded PMOS transistor is coupled to the fourth signal; and
   a third and fourth cascoded NMOS transistor coupled between the first node and the Vss wherein a gate of the first cascoded NMOS transistor is coupled to the second signal and a gate of the second cascoded NMOS transistor is coupled to the third signal.

7. The IC of claim 6, wherein the third and fourth signals assert in substantially different times.

8. A word-line (WL) driver for a pseudo two-port memory, the WL driver comprising:
   a first and a second pull-down circuit controlled by a first and a second signal, respectively, and coupled between a first node and a low voltage power supply (Vss); and
   a controllable pull-up circuit coupled between the first node and a complimentary high voltage power supply (Vcc), the pull-up circuit further comprising a first PMOS transistor connected in series to a second PMOS transistor connected in series, wherein a gate of the first PMOS transistor is coupled to the first decoded address signal and a gate of the second PMOS transistor is coupled to the second decoded address signal,
   wherein when either the first or second signal is asserted to a predetermined logic state, the first node is pulled down to a logic LOW state, and wherein the first and second signals are decoded address signals.

9. The WL driver of claim 8 further comprising a predetermined number of inverters serially connected between the first node and a WL intended to be driven by the WL driver.

10. The WL driver of claim 8, wherein
    the first pull-down circuit comprises at least one first N-type metal-oxide-semiconductor (NMOS) transistor with a gate coupled to the first decoded address signal, a source coupled to the Vss and a drain coupled to the first node; and
    the second pull-down circuit comprises at least one second NMOS transistor with a gate coupled to the second decoded address signal, a source coupled to the Vss and a drain coupled to the first node.

11. The WL driver of claim 10, wherein the predetermined logic state is a logic HIGH state.

12. The WL driver of claim 11, wherein when either the first or second decoded address signal is asserted to a logic HIGH state, the first node will stop being pulled up to the Vcc.

13. The WL driver of claim 8 further comprising:
    a third and fourth signal coupled to the first and second pull-down circuit; and
    a fifth signal coupled to the controllable pull-up circuit,
    wherein the controllable pull-up circuit comprises at least one PMOS transistor with the source and drain coupled between the first node and the Vcc and a gate coupled to the fifth signal; and wherein the first pull-down circuit comprises:
a first and second cascoded PMOS transistors coupled between the Vcc and the first node, wherein a gate of the first cascoded PMOS transistor is coupled to the first decoded address signal and a gate of the second cascoded PMOS transistor is coupled to the third signal; and
a first and second cascoded NMOS transistors coupled between the first node and the Vss, wherein a gate of the first cascoded NMOS transistor is coupled to the first decoded address signal and a gate of the second cascoded NMOS transistor is coupled to the fourth signal; and
wherein the second pull-down circuit comprises:
a third and fourth cascoded PMOS transistors coupled between the Vcc and first node, wherein a gate of the third cascoded PMOS transistor is coupled to the second decoded address signal and a gate of the fourth cascoded PMOS transistor is coupled to the fourth signal; and
a third and fourth cascoded NMOS transistors coupled between the first node and the Vss, wherein a gate of the first cascoded NMOS transistor is coupled to the second decoded address signal and a gate of the second cascoded NMOS transistor is coupled to the third signal.

14. The WL driver of claim 13, wherein the third and fourth signals assert in substantially different times.

15. A word-line (WL) driver for a pseudo two-port memory, the WL driver comprising:
a first and a second pull-down circuits controlled by a first and second decoded address signals, respectively, and coupled between a first node and a low voltage power supply (Vss);
a controllable pull-up circuit coupled between the first node and a complimentary high voltage power supply (Vcc), the pull-up circuit further comprising a first PMOS transistor connected in series to a second PMOS transistor, wherein a gate of the first PMOS transistor is coupled to the first decoded address signal and a gate of the second PMOS transistor is coupled to the second decoded address signal; and
a predetermined number of inverters serially connected between the first node and a WL intended to be driven by the WL driver,
wherein when either the first or second signal is asserted to a first predetermined logic state, the WL is asserted to a second predetermined logic state.

16. The WL driver of claim 15, wherein
the first pull-down circuit comprises at least one first N-type metal-oxide-semiconductor (NMOS) transistor with a gate coupled to the first decoded address signal, a source coupled to the Vss and a drain coupled to the first node; and
the second pull-down circuit comprises at least one second NMOS transistor with a gate coupled to the second decoded address signal, a source coupled to the Vss and a drain coupled to the first node.

17. The WL driver of claim 15, wherein when either the first or second decoded address signal is asserted to a logic HIGH state, the first node will stop being pulled up to the Vcc.

18. The WL driver of claim 15 further comprising:
a third and fourth signal coupled to the first and second pull-down circuits; and
a fifth signal coupled to the controllable pull-up circuit,
wherein the controllable pull-up circuit comprises at least one PMOS transistor with source and drain coupled between the first node and the Vcc and a gate coupled to the fifth signal; and
wherein the first pull-down circuit comprises:
a first and second cascoded PMOS transistors coupled between the Vcc and the first node, wherein a gate of the first cascoded PMOS transistor is coupled to the first decoded address signal and a gate of the second cascoded PMOS transistor is coupled to the third signal; and
a first and second cascoded NMOS transistors coupled between the first node and the Vss, wherein a gate of the first cascoded NMOS transistor is coupled to the first decoded address signal and a gate of the second cascoded NMOS transistor is coupled to the fourth signal; and
wherein the second pull-down circuit comprises:
a third and fourth cascoded PMOS transistor coupled between the Vcc and first node, wherein a gate of the third cascoded PMOS transistor is coupled to the second decoded address signal and a gate of the fourth cascoded PMOS transistor is coupled to the fourth signal; and
a third and fourth cascoded NMOS transistors coupled between the first node and the Vss, wherein a gate of the first cascoded NMOS transistor is coupled to the second decoded address signal and a gate of the second cascoded NMOS transistor is coupled to the third signal.

19. The WL driver of claim 18, wherein the third and fourth signals assert in substantially different times.

* * * * *